(12) United States Patent
Hung et al.

(10) Patent No.: US 6,396,129 B1
(45) Date of Patent: May 28, 2002

(54) LEADFRAME WITH DOT ARRAY OF SILVER-PLATED REGIONS ON DIE PAD FOR USE IN EXPOSED-PAD SEMICONDUCTOR PACKAGE

(75) Inventors: Chin-Yuan Hung; Chang-Fu Chen; Fu-Di Tang, all of Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/800,361

(22) Filed: Mar. 5, 2001

(51) Int. Cl.[7] .................. H01L 23/495; H01L 23/48
(52) U.S. Cl. .................. 257/666; 257/787; 257/783; 257/676
(58) Field of Search ............... 257/666, 787, 257/783, 698, 693, 691, 676; 438/123, 112, 127

(56) References Cited

U.S. PATENT DOCUMENTS

| | | | | |
|---|---|---|---|---|
| 4,942,455 A | * | 7/1990 | Shinohara | 257/666 |
| 5,153,706 A | | 10/1992 | Baba et al. | 257/666 |
| 5,780,931 A | * | 7/1998 | Shimoda et al. | 257/779 |
| 6,034,422 A | * | 3/2000 | Horita et al. | 257/677 |

FOREIGN PATENT DOCUMENTS

JP 63-296255 * 12/1988 .................. 257/666

* cited by examiner

*Primary Examiner*—Jasmine J. B. Clark
(74) *Attorney, Agent, or Firm*—Peter F. Corless; Steven M. Jensen; Edwards & Angell, LLP

(57) ABSTRACT

A leadframe with a dot array of silver-plated regions on die pad is proposed, which is designed specifically for use in the construction of an exposed-pad type of semiconductor package. The proposed leadframe is characterized by that the front side of the die pad is partitioned into a centrally-located die-mounting area and a peripherally-located ground-wire bonding area; and wherein the die-mounting area is selectively silver-plated to form a dot array of silver-plated regions, while the peripheral area of the die pad is entirely silver-plated to form a silver-plated peripheral area. In addition, the die-mounting area of the die pad can be further formed with a plurality of dimples for the purpose of increasing the contact area between the die pad and a silver-epoxy layer that is to be pasted over the die-mounting area for use to adhere a semiconductor chip to the die pad. Owing to the provision of the dot array of silver-plated regions within the die-mounting area, it allows a better electrical coupling between the die pad and the inactive surface of the semiconductor chip than the conventional ring plating scheme so that the packaged semiconductor chip can have a better grounding effect, and also allows the silver-epoxy layer to be better adhered to the die pad than the conventional spotted plating scheme to prevent delamination.

7 Claims, 3 Drawing Sheets

LEADFRAME WITH DOT ARRAY OF SILVER-PLATED REGIONS ON DIE PAD FOR USE IN EXPOSED-PAD SEMICONDUCTOR PACKAGE

BACKGROUND OF THE INVENTION

1. Field of the Invention

The present invention relates to semiconductor packaging technology, and more particularly, to a leadframe with a dot array of silver-plated regions on die pad, which is designed specifically for use in the construction of an exposed-pad type of semiconductor package.

2. Description of Related Art

A leadframe is a metal-made frame that includes a centrally-located die pad and a plurality of peripherally-located leads surrounding the die pad. The die pad is used for mounting a semiconductor die (chip) while the leads are used to serve as external connecting means for the semiconductor chip. After the semiconductor chip is wire-bonded to the leads, the die pad together with the semiconductor chip are encapsulated in an epoxy-molded compound (EMC) to form a semiconductor package.

An exposed-pad type of semiconductor package is characterized by that the die pad of the leadframe has its back side exposed to the bottom outside of the encapsulation body. During SMT (Surface Mount Technology) process when the exposed-pad semiconductor package is mounted on a printed circuit board (PCB), it allows the exposed back side of the die pad to be directly soldered to the PCB's ground plane, thereby allowing the semiconductor chip enclosed in the encapsulation body to have a better grounding effect.

FIG. 1 is a schematic sectional diagram showing a conventional exposed-pad type of semiconductor package. As shown, this semiconductor package comprises: (a) a leadframe 1, which is typically made of copper, and which includes a die pad 10, an inner-lead portion 20, and an outer-lead portion 30; the die pad 10 having a front side 10a and a back side 10b, and whose front side 10a is partitioned into a centrally-located die-mounting area 11 and a peripherally-located ground-wire bonding area 12; (b) a silver-epoxy layer 50 pasted over the die-mounting area 11 of the die pad 10; (c) a semiconductor chip 60 having an active surface 60a and an inactive surface 60b, and whose inactive surface 60b is adhered by means of the silver-epoxy layer 50 to the die-mounting area 11 of the die pad 10; (c) a plurality of bonding wires 70, including a set of I/O wires 71 bonded from the active surface 60a of the semiconductor chip 60 to the inner-lead portion 20 of the leadframe 1 and at least one ground wire 72 down bonded from the active surface 60a of the semiconductor chip 60 to the ground-wire bonding area 12 of the die pad 10; and (d) an encapsulation body 80 which encapsulates the semiconductor chip 60 together with the inner-lead portion 20, the silver-epoxy layer 50, the bonding wires 70, and the front side 10a of the die pad 10, while exposing the back side 10b of the die pad 10 to the outside. This semiconductor package is customarily referred to as exposed-pad type due to the fact that the back side 10b of the die pad 10 is exposed to the outside of the encapsulation body 80.

During SMT process when the exposed-pad semiconductor package is mounted on a PCB 90 having a ground plane 91, the exposed back side 10b of the die pad 10 can be directly soldered to the ground plane 91 so as to establish a direct grounding path for the packaged semiconductor chip 60.

Conventionally, the leadframe 1 can be plated with silver so as to increase its wire bondability. Presently, there are two plating schemes to serve this purpose: a ring plating scheme and a spotted plating scheme, which are respectively depicted in the following with reference to FIG. 2A and FIG. 2B.

As shown in FIG. 2A, by the ring plating scheme, silver is selectively plated over the ground-wire bonding area 12 of the die pad 10 and over the inner-lead portion 20 of the leadframe 1, while leaving the die-mounting area 11 unplated (the silver-plated areas are illustrated as shaded areas in FIG. 2A). This ring plating scheme is advantageous in that it allows the silver-epoxy layer 50 to be more securely adhered to the die-mounting area 11 of the die pad 10 without delamination (this is because that epoxy adheres to copper better than to silver); but has the drawback of a reduced electrically coupling effect between the inactive surface 60b of the semiconductor chip 60 and the die pad 10, undesirably resulting in a reduced grounding effect for the semiconductor chip 60.

As shown in FIG. 2B, by the spotted plating scheme, silver is selectively plated over the while of the die-mounting area 11, the whole of the ground-wire bonding area 12, and the inner-lead portion 20 (the silver-plated areas are illustrated as shaded areas in FIG. 2B). This spotted plating scheme is advantageous in that it allows a better electrically coupling effect between the active surface 60a of the semiconductor chip 60 and the die pad 10, but has the drawback of making the silver-epoxy layer 150 easily subjected to delamination from the die pad 10.

Related patents, include, for example, the U.S. Pat. No. 5,153,706 entitled "LEAD FRAMES FOR USE IN PLASTIC MOLD TYPE SEMICONDUCTOR DEVICES". This patent discloses a leadframe whose die pad is metal-plated on the edge areas opposite to the inner leads, while leaving the centrally-located die-mounting area unplated. Undesirably, however, since this plating scheme is substantially the same as the ring plating scheme depicted in FIG. 2A, the utilization of this patent nevertheless has the same drawback.

SUMMARY OF THE INVENTION

It is therefore an objective of this invention to provide a leadframe with a dot array of silver-plated regions on die pad, which allows the semiconductor chip to be more securely adhered to the die pad without delamination and also allows the inactive surface of the semiconductor chip to be better electrically coupled to the die pad to provide a better grounding effect.

In accordance with the foregoing and other objectives, the invention proposes a leadframe with a dot array of silver-plated regions on die pad for use in the construction of an exposed-pad semiconductor package.

Broadly recited, the leadframe of the invention comprises: (a) a die pad having a front side and a back side, and whose front side is partitioned into a centrally-located die-mounting area and a peripheral area surrounding the die-mounting area; wherein the die-mounting area of the die pad is selectively metal-plated to form a dot array of metal-plated regions; and the peripheral area of the die pad is entirely metal-plated to form a metal-plated peripheral area; and (b) a plurality of leads surrounding the die pad; the leads including an inner-lead portion and an outer-lead portion; wherein the inner-lead portion of each of the leads is metal-plated to form a metal-plated lead area.

In addition, the die-mounting area of the die pad can be further formed with a plurality of dimples for the purpose of increasing the contact area between the die pad and a silver-epoxy layer that is to be pasted over the die-mounting area for use to adhere a semiconductor chip to the die pad.

By using the leadframe of the invention in the construction of an exposed-pad semiconductor package, owing to the provision of the dot array of silver-plated regions within the die-mounting area of the die pad, it allows a better electrical coupling between the die pad and the inactive surface of the semiconductor chip than the prior art of FIG. 2A so that the packaged semiconductor chip can have a better grounding effect, and also allows the silver-epoxy layer to be better adhered to the die pad than the prior art of FIG. 2B to prevent delamination. Moreover, owing to the additional provision of the dimples within the die-mounting area of the die pad, it allows an increased contact area between the die-mounting area and the silver-epoxy layer, so that the silver-epoxy layer can be more strongly adhered to the die-mounting area without delamination.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The leadframe according to the invention is disclosed in full details by way of two preferred embodiments in the following with reference to FIGS. 3A–3C and FIGS. 4A–4C, respectively.

Figure 3A:
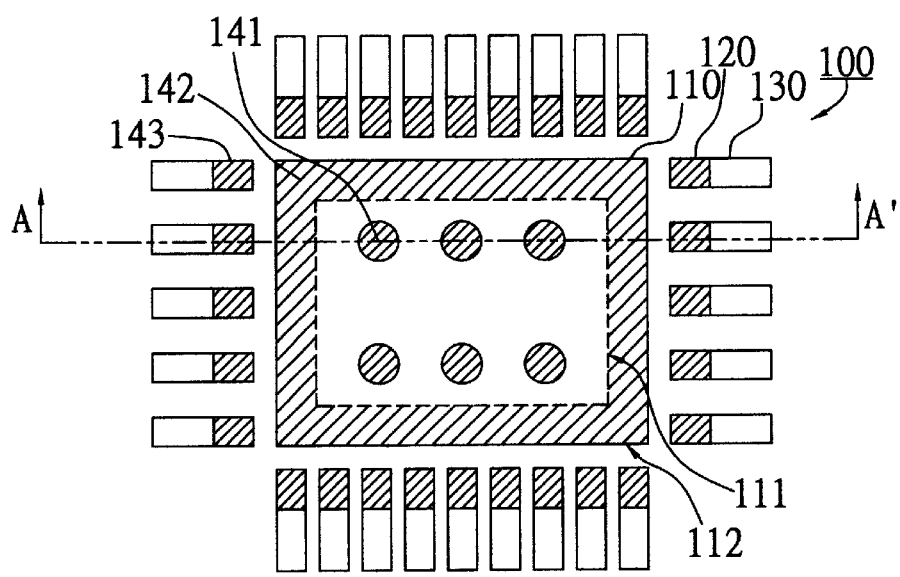
FIG. 3A shows a schematic top view of a first preferred embodiment of the leadframe according to the invention.
Figure 3B:
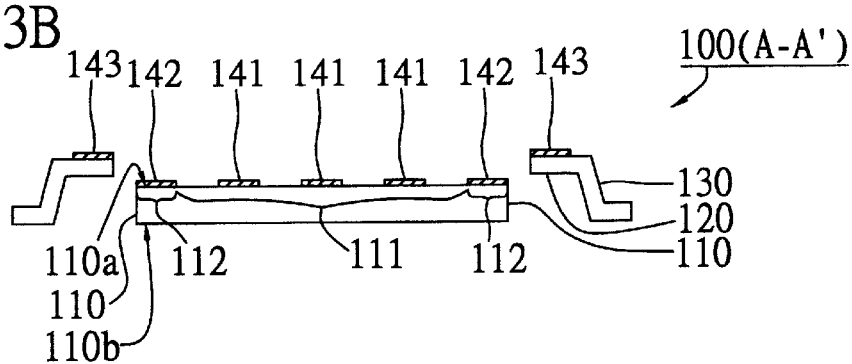
FIG. 3B shows a schematic sectional view of the leadframe of FIG. 3A cutting through the line A–A'.
Figure 3C:
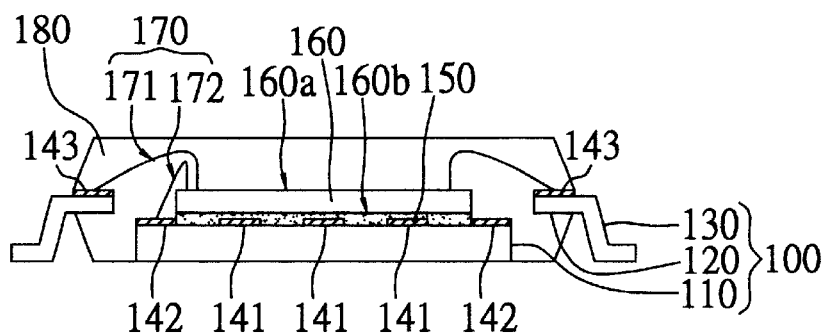
FIG. 3C is a schematic sectional diagram showing the utilization of the leadframe of FIGS. 3A–3B in the construction of an exposed-pad semiconductor package.

First Preferred Embodiment (FIGS. 3A–3C)

The first preferred embodiment of the leadframe according to the invention is disclosed in full details in the following with reference to FIGS. 3A–3C.

Referring first to FIG. 3A and FIG. 3B, the leadframe 100 of the first embodiment comprises a die pad 110, an inner-lead portion 120, and an outer-lead portion 130. The die pad 110 has a front side 110a and a back side 110b, and whose front side 110a is partitioned into a centrally-located die-mounting area 111 (the area enclosed by the dashed box in FIG. 3A) and a peripherally-located ground-wire bonding area 112 surrounding the die-mounting area 111. The die-mounting area 111 is dimensioned substantially equal to the size of the semiconductor chip (shown later in FIG. 3C with the reference numeral 160) that is to be mounted on the die pad 110.

By the invention, a silver-plating process is performed on the leadframe 100 in such a manner that the die-mounting area 111 of the die pad 110 is selectively silver-plated to form a dot array of silver-plated regions 141; the ground-wire bonding area 112 of the die pad 110 is entirely silver-plated to form a silver-plated peripheral area 142; and the inner-lead portion 120 is silver-plated to form a silver-plated lead area 143. The dot array of silver-plated regions 141 can be formed in any suitable shape, such circles (as in the case of FIG. 3A) or squares; which is only a matter of arbitrary design choice. However, it is preferable that the dot array of silver-plated regions 141 are scattered evenly over the die-mounting area 111.

FIG. 3C is a schematic sectional diagram showing the utilization of the leadframe 100 of FIGS. 3A–3B in the construction of an exposed-pad semiconductor package.

As shown, during package assembly process, a silver-epoxy layer 150 is pasted over the die-mounting area 111 of the die pad 110 to a thickness that can cover the dot array of silver-plated regions 141. Next, a semiconductor chip 160 (which has an active surface 160a and an inactive surface 160b) has its inactive surface 160b adhered by means of the silver-epoxy layer 150 to the die-mounting area 111 of the die pad 110. After this, a wire-bonding process is performed to bond a plurality of bonding wires 170, including a set of I/O wires 171 bonded from the active surface 160a of the semiconductor chip 160 to the inner-lead portion 120 of the leadframe 100 and at least one ground wire 172 down bonded from the active surface 160a of the semiconductor chip 160 to the silver-plated peripheral area 142 on the ground-wire bonding area 112 of the die pad 110. Finally, a molding process is performed to form an encapsulation body 180 to encapsulates the semiconductor chip 160 together with the inner-lead portion 120, the silver-epoxy layer 150, the bonding wires 170, and the front side 110a of the die pad 110, while exposing the back side 110b of the die pad 110 to the outside.

Figure 1:
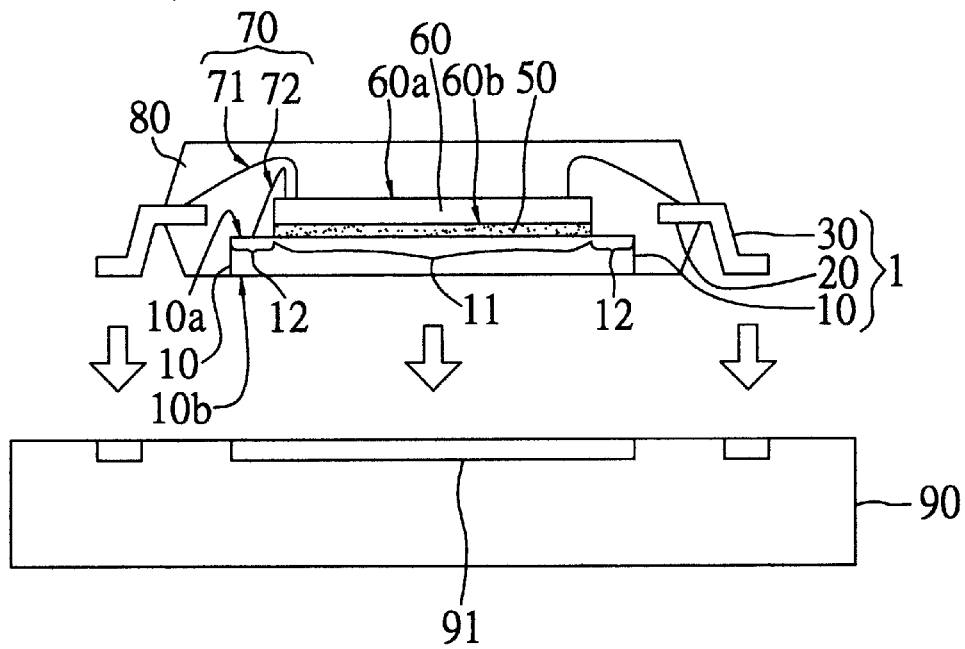
FIG. 1 (PRIOR ART) is a schematic sectional diagram showing a conventional exposed-pad type of semiconductor package.
Figure 2A:
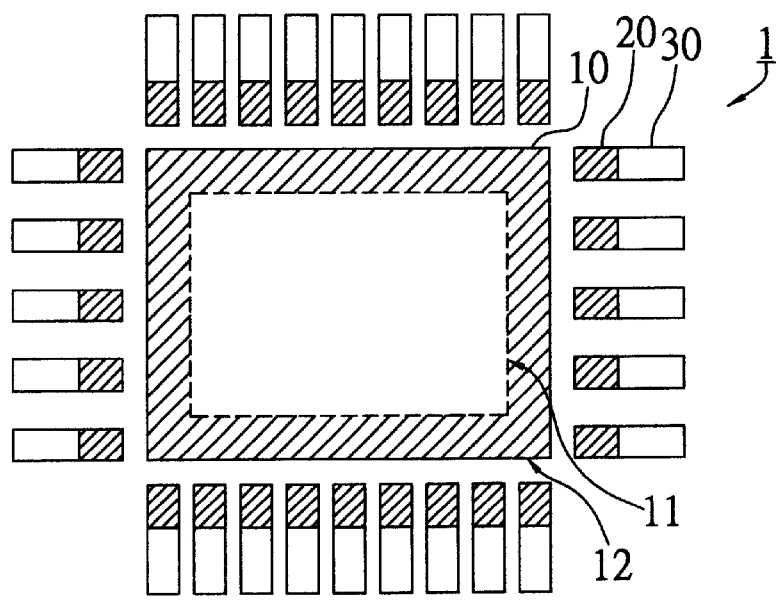
FIG. 2A (PRIOR ART) shows a schematic top view of a conventional leadframe which is silver-plated by a ring plating scheme.
Figure 2B:
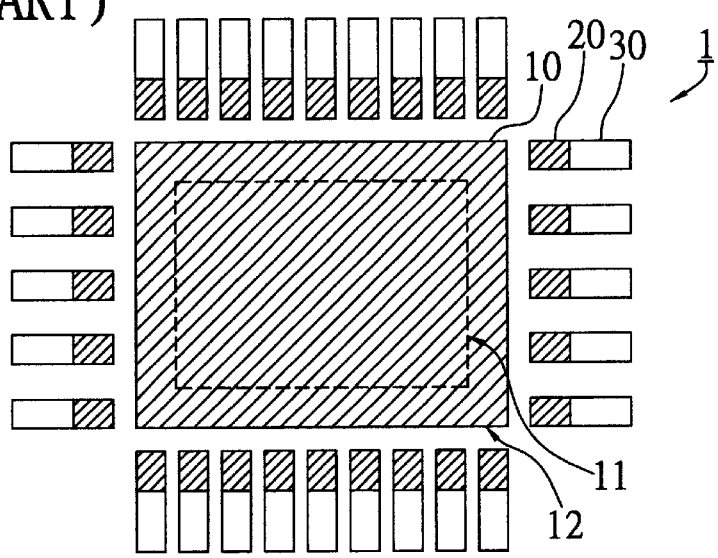
FIG. 2B (PRIOR ART) shows a schematic top view of a conventional leadframe which is silver-plated by a spotted plating scheme.

In the foregoing exposed-pad semiconductor package, owing to the provision of the dot array of silver-plated regions 141 within the die-mounting area 111 of the die pad 110, it allows a better electrical coupling between the die pad 110 and the inactive surface 160b of the semiconductor chip 160 by means of the silver-epoxy layer 150 than the prior art of FIG. 2A, thereby allowing the semiconductor chip 160 to have a better grounding effect. In addition, it also allows the silver-epoxy layer 150 to be better adhered to the die-mounting area 111 than the prior art of FIG. 2B to prevent delamination.

Figure 4A:
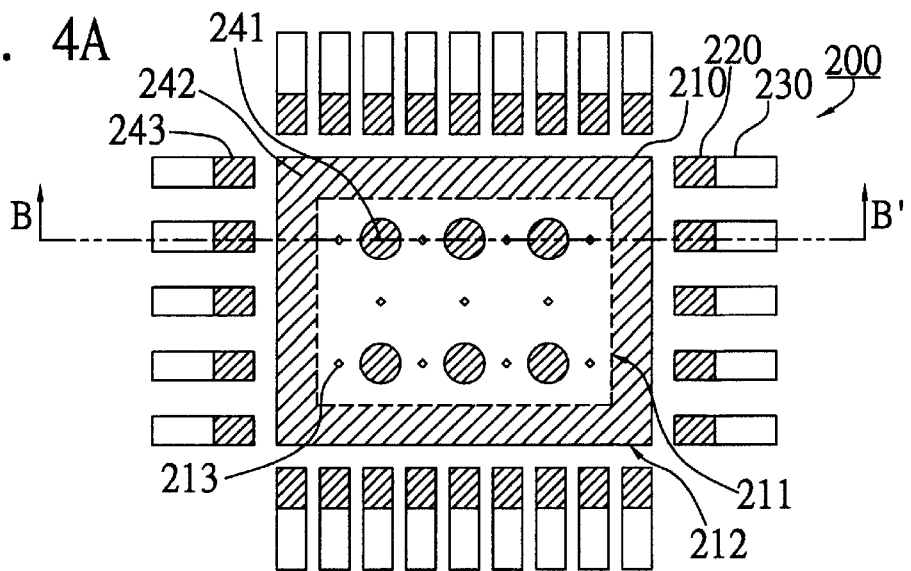
FIG. 4A shows a schematic top view of a second preferred embodiment of the leadframe according to the invention.
Figure 4B:
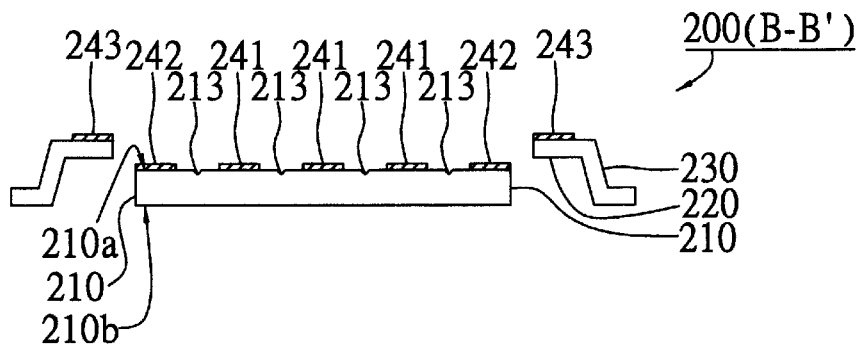
FIG. 4B shows a schematic sectional view of the leadframe of FIG. 4A cutting through the line B–B'.
Figure 4C:
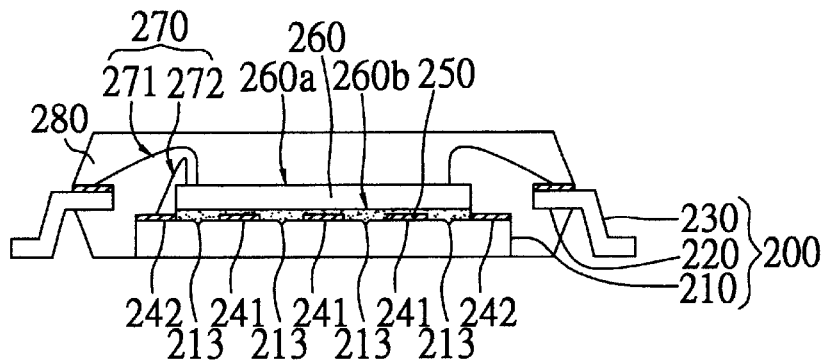
FIG. 4C is a schematic sectional diagram showing the utilization of the leadframe of FIGS. 4A–4B in the construction of an exposed-pad semiconductor package.

Second Preferred Embodiment (FIGS. 4A–4C)

The second preferred embodiment of the leadframe according to the invention is disclosed in full details in the following with reference to FIGS. 4A–4C.

Referring first to FIG. 4A and FIG. 4B, the leadframe 200 of the second embodiment comprises a die pad 210, an inner-lead portion 220, and an outer-lead portion 230. The die pad 210 has a front side 210a and a back side 210b, and whose front side 210a is partitioned into a centrally-located die-mounting area 211 (the area enclosed by the dashed box in FIG. 3A) and a peripherally-located ground-wire bonding area 212 surrounding the die-mounting area 211. The die-mounting area 211 is dimensioned substantially equal to the size of the semiconductor chip (shown later in FIG. 3C with the reference numeral 260) that is to be mounted on the die pad 210.

The leadframe 200 of this embodiment shown in FIGS. 4A–4B is substantially silver-plated in the same manner as the previous embodiment shown in FIGS. 3A–3B, i.e., it also includes a dot array of silver-plated regions 241 within the die-mounting area 211 of the die pad 210; a silver-plated peripheral area 242 over the ground-wire bonding area 212 of the die pad 210; and a silver-plated lead area 243 over the inner-lead portion 220 of the leadframe 200.

The leadframe 200 of this embodiment differs from the previous embodiment shown in FIGS. 3A–3B particularly in that here in this embodiment the die-mounting area 211 of the die pad 210 is further formed with a plurality of dimples 213, preferably scattered evenly over he areas beyond the dot array of silver-plated regions 241. The provision of these dimples 213 allows an increase in the contact area between the die pad 210 and the subsequently pasted silver-epoxy layer (shown later in FIG. 4C with the reference numeral 250) over the die pad 210.

FIG. 4C is a schematic sectional diagram showing the utilization of the leadframe 200 of FIGS. 4A–4B in the construction of an exposed-pad semiconductor package.

As shown, during package assembly process, a silver-epoxy layer 250 is pasted over the die-mounting area 211 of the die pad 210 to a thickness that can cover the dot array of silver-plated regions 241. Next, a semiconductor chip 260 (which has an active surface 260a and an inactive surface 260b) has its inactive surface 260b adhered by means of the silver-epoxy layer 250 to the die-mounting area 211 of the die pad 210. After this, a wire-bonding process is performed to bond a plurality of bonding wires 270, including a set of I/O wires 271 bonded from the active surface 260a of the semiconductor chip 260 to the inner-lead portion 220 of the leadframe 200 and at least one ground wire 272 down bonded from the active surface 260a of the semiconductor chip 260 to the silver-plated peripheral area 242 on the ground-wire bonding area 212 of the die pad 210. Finally, a molding process is performed to form an encapsulation body 280 to encapsulates the semiconductor chip 260 together with the inner-lead portion 220, the silver-epoxy layer 250, the bonding wires 270, and the front side 210a of the die pad 210, while exposing the back side 210b of the die pad 210 to the outside.

In the foregoing exposed-pad semiconductor package, owing to the provision of the dot array of silver-plated regions 241 within the die-mounting area 211 of the die pad 210, it allows a better electrical coupling between the die pad 210 and the inactive surface 260b of the semiconductor chip 260 by means of the silver-epoxy layer 250 than the prior art of FIG. 2A, thereby allowing the semiconductor chip 260 to have a better grounding effect. In addition, it also allows the silver-epoxy layer 250 to be better adhered to the die-mounting area 211 than the prior art of FIG. 2B to prevent delamination.

Moreover, owing to the additional provision of the dimples 213 within the die-mounting area 211 of the die pad 210, it allows an increased contact area between the die-mounting area 211 and the silver-epoxy layer 250, so that the silver-epoxy layer 250 can be more strongly adhered to the die-mounting areas 211 without delamination.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A leadframe, which comprises:

(a) a die pad having a front side and a back side, and whose front side is partitioned into a centrally-located die-mounting area and a peripherally-located ground-wire bonding area;
    wherein
    the die-mounting area of the die pad is selectively metal-plated to form a dot array of metal-plated regions; and
    the ground-wire bonding area of the die pad is entirely metal-plated to form a metal-plated peripheral area; and (b) a plurality of leads surrounding the die pad; the leads including an inner-lead portion and an outer-lead portion;
    wherein
    the inner-lead portion of each of the leads is metal-plated to form a metal-plated lead area.

2. The leadframe of claim 1, wherein the die-mounting area of the die pad is further formed with a plurality of dimples for the purpose of increasing the contact area between the die pad and a silver-epoxy layer that is to be pasted over the die-mounting area for use to adhere a semiconductor chip to the die pad.

3. The leadframe of claim 1, wherein the metal is silver.

4. A leadframe, which comprises:

(a) a die pad having a front side and a back side, and whose front side is partitioned into a centrally-located die-mounting area and a peripherally-located ground-wire bonding area, with the die-mounting area of the die pad being further formed with a plurality of dimples for the purpose of increasing the contact area between the die pad and a silver-epoxy layer that is to be pasted over the die-mounting area for use to adhere a semiconductor chip to the die pad;
    wherein
    the die-mounting area of the die pad is selectively metal-plated to form a dot array of metal-plated regions; and
    the ground-wire bonding area of the die pad is entirely metal-plated to form a metal-plated peripheral area; and (b) a plurality of leads surrounding the die pad; the leads including an inner-lead portion and an outer-lead portion;
    wherein
    the inner-lead portion of each of the leads is metal-plated to form a metal-lead area.

5. The leadframe of claim 4, wherein the metal is silver.

6. An exposed-pad semiconductor package, which comprises:

(a) a leadframe including a die pad, an inner-lead portion, and an outer-lead portion; the die pad having a front side and a back side, and whose front side is partitioned into a centrally-located die-mounting area and a peripherally-located ground-wire bonding area;
    wherein
    the die-mounting area of the die pad is selectively silver-plated to form a dot array of silver-plated regions;

the ground-wire bonding area of the die pad is entirely silver-plated to form a silver-plated peripheral area; and the inner-lead portion is silver-plated to form a silver-plated lead area;

(b) a silver-epoxy layer pasted over the die-mounting area of the die pad and covering the dot array of silver-plated regions;

(c) a semiconductor chip adhered by means of the silver-epoxy layer to the die-mounting area of the die pad;

(d) a plurality of bonding wires, including a set of I/O wires which are bonded from the active surface of the semiconductor chip to the inner-lead portion of the leadframe, and at least one ground wire which are down bonded from the active surface of the semiconductor chip to the silver-plated peripheral area of the die pad; and (e) an encapsulation body which encapsulates the semiconductor chip, the inner-lead portion, the silver-epoxy layer, the bonding wires, and the front side of the die pad, while exposing the back side of the die pad to outside.

7. The exposed-pad semiconductor package of claim 6, wherein the die-mounting area of the die pad is further formed with a plurality of dimples for the purpose of increasing the contact area between the die-mounting area of the die pad and the silver-epoxy layer.

* * * * *